(12) United States Patent
Collins et al.

(10) Patent No.: US 6,352,935 B1
(45) Date of Patent: Mar. 5, 2002

(54) METHOD OF FORMING A COVER CAP FOR SEMICONDUCTOR WAFER DEVICES

(75) Inventors: David J. Collins, Windham, NH (US); Craig E. Core, North Andover, MA (US); Lawrence E. Felton, Hopkinton, MA (US); Jing Luo, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/484,991

(22) Filed: Jan. 18, 2000

(51) Int. Cl.⁷ .......................................... H01L 21/302

(52) U.S. Cl. ...................................... 438/708; 438/118

(58) Field of Search ................................. 257/700, 706, 257/712, 723; 438/106, 107, 111–118, 124, 126, 127, 708, 709, 788, 792, 947

(56) References Cited

U.S. PATENT DOCUMENTS

| | | |
|---|---|---|
| 4,626,960 A | 12/1986 | Hamano et al. |
| 4,786,357 A | 11/1988 | Campanelli et al. |
| 4,888,449 A | 12/1989 | Crane et al. |
| 4,910,584 A | 3/1990 | Mizuo |
| 5,018,004 A | 5/1991 | Okinaga et al. |
| 5,034,044 A | 7/1991 | Glascock, II |
| 5,304,453 A * | 4/1994 | Lin .......................... 430/252 |
| 5,436,407 A | 7/1995 | Fehr et al. |
| 5,491,110 A | 2/1996 | Fehr et al. |
| 5,504,026 A | 4/1996 | Kung |
| 5,604,160 A | 2/1997 | Warfield |
| 5,798,557 A | 8/1998 | Salatino et al. |
| 5,847,280 A | 12/1998 | Sherman et al. |
| 5,852,320 A | 12/1998 | Ichihashi |
| 5,886,457 A | 3/1999 | Maesaka et al. |
| 5,903,437 A | 5/1999 | Pierson et al. |
| 6,027,630 A * | 2/2000 | Cohen ........................ 205/135 |

OTHER PUBLICATIONS

Roylance et al., "A Batch–Fabricated Silicon Accelerometer," *IEEE Trans. Electron Devices*, vol. ED–26, No. 12, Dec. 1979, pp. 352–358.

Rudolf et al., "Silicon Microaccelerameter," *Transducers '87*, Rec. of the 4th Int. Conf. On Solid State Sensors and Actuators, 1987, pp. 376–379.

Kurt Petersen et al., "Silicon Fusion Bonding for Pressure Sensors," Rec. of the IEEE Solid–State Sensor and Actuator Workshop, 1988, pp. 209–212.

(List continued on next page.)

*Primary Examiner*—Matthew Smith
*Assistant Examiner*—Calvin Lee
(74) *Attorney, Agent, or Firm*—Wolf, Greenfield & Sacks, P.C.

(57) ABSTRACT

A method for capping active areas of a semiconductor wafer uses photolithography to define areas of sealant on the cap wafer to thereby reduce the amount of space required for attaching the cap wafer to the semiconductor wafer carrying active areas to be capped. Using photolithography in this manner increases the amount of space on the semiconductor wafer that can be used to form active areas which, in turn, improves the density of active area on the semiconductor wafer. In one embodiment, the method includes the steps of applying a photoimageable layer, photoimaging the photoimageable layer to define a pattern including remaining regions of the photoimageable layer and removed regions of the photoimageable layer, and using the pattern to define the sealant regions on the semiconductor wafer. The method may further include one or more steps, such as applying sealant to the sealant regions defined by the pattern, curing the sealant, removing the remaining regions after applying the sealant to the sealant regions, removing excess sealant not within the sealant regions, and using the sealant material to form at least one seal around at least one active area formed on the second semiconductor substrate.

29 Claims, 10 Drawing Sheets

OTHER PUBLICATIONS

W.H. Ko et al., "Bonding Techniques for Microsensors," *Micromachining and Micropackaging of Transducers*, 1985, pp. 198–208.

R.L. Smith et al., "Micromachined Packaging for Chemical Microsensors," *IEEE Trans. Electron Devices*, vol. 35 No. 6, Jun. 1988, pp. 192–197.

Christopher W. Arento et al., "Photolithography Applications for Evaporative, Plated, and Printed Wafer Bumping Interconnect Technologies," The International Journal of Microcircuits and Electronic Packaging, vol. 22, No. 2, Second Quarter 1999 (ISSN 1063–1674), pp. 152–156.

* cited by examiner

METHOD OF FORMING A COVER CAP FOR SEMICONDUCTOR WAFER DEVICES

1. FIELD OF THE INVENTION

The present invention relates to semiconductor devices and, more particularly, to a method of mounting a protective cover on a semiconductor wafer substrate on which one or more devices have been fabricated.

2. BACKGROUND OF THE INVENTION

It is possible to implement many types of devices on a semiconductor wafer using known processes. Typically, multiple devices are implemented on a single semiconductor wafer and then are separated into individual components by sawing the wafer into multiple parts ("dicing"), each part containing one or more devices. To avoid excessive heat build-up on the wafer and to prevent the devices from being damaged by heating which may occur during dicing, it is conventional to spray the wafer with water or another type of liquid to cool the wafer during the dicing process.

For many types of devices, using liquid to cool the wafer during the dicing process does not affect the function of the device after dicing has been completed. However, other semiconductor devices are extremely fragile and/or sensitive to, and may be negatively affected by, environmental hazards, such as dust or other particulates, moisture, and inadvertent scratching, collectively "contaminants."

One example of a device that may be adversely affected by being exposed to contaminants during the dicing process is a micro-mechanical structure, useful, e.g., as an acceleration or pressure sensor. A typical micro-mechanical structure has a cantilevered beam or other structure that resides above the surface of the substrate. Movement of the beam of the micro-mechanical structure relative to the base may be used to determine a physical variable, such as acceleration or pressure. Particulate matter or moisture may impede movement of the micro-mechanical structure or may otherwise adversely affect generation of a signal from movement of the micro-mechanical structure.

As a result, it has become common in the industry to protect micro-mechanical structures and other devices resident on a semiconductor substrate after fabrication to prevent active areas of the semiconductor substrate from becoming contaminated during subsequent processing. As used herein, the term "active area" will be used to refer to that portion of a semiconductor substrate that should be or is desired to be protected from contamination. An "active area" as that term is used herein may, but need not, include a micro-mechanical structure. Multiple active areas may be formed on a single wafer.

There are several known techniques that may be used to protect the active area of a semiconductor substrate during processing. One method involves placing several layers of protective tape over the active areas to prevent the active areas from being contaminated. In this method, a first layer of tape having holes corresponding to the locations of the active areas is initially applied to the wafer and then a second layer of tape is applied over an exposed surface of the first layer of tape. This method requires the wafer to be diced from the back side of the wafer instead of the front side of the wafer, which makes it more difficult to align the dicing saw so that the dicing saw does not cut through the active areas on the wafer. An exemplary saw usable in this context is disclosed in U.S. Pat. No. 5,356,681, the content of which is hereby incorporated by reference. Moreover, the tape requires substantial surface area to be effective, thus reducing the density of active areas on the semiconductor. As used herein, the term density will be used to refer to the number of active areas per unit area that may be formed on any one wafer.

A second known technique of protecting active areas of the silicon wafer is to apply a protective cap wafer to an exposed surface of the semiconductor substrate containing the active areas prior to dicing. Typically, the protective cap wafer is sealed to the semiconductor substrate with a lead oxide glass frit or another sealant. This sealant is screen printed on the cap and then bonded to the semiconductor substrate under heat and pressure to form individual hermetic seals around an active area on the semiconductor substrate. The micro-mechanical structures or other devices in the active areas are sealed below the cap wafer and are free to move, yet are protected from the external environmental hazards. This technique is advantageous in that it allows standard front side dicing to be used to separate the semiconductor wafer into individual elements. Screen printing lead oxide glass frit also uses less surface area than the tape method, thus increasing density.

Unfortunately, constraints associated with screen printing limit the accuracy with which the sealant may be deposited on the cap and the minimum width of the lines that may be formed. Thus, although screen printing sealant is better than using the tape method, limitations attendant to screen printing require the sealant to occupy an overly large area on the semiconductor wafer, thus limiting the overall yield achievable with this method.

For example, as shown in FIG. 1, screen printing sealant results in a relatively thick line 100 of sealant. Specifically, using current technology, the minimum line width achievable using screen printing is about 150 $\mu$m. Moreover, screen printing does not permit interior corners 105 to be accurately defined, thus necessitating an offset between an interior edge of the line of sealant and the outer edge of the active area, shown in dashed lines in FIG. 10. Finally the width of the sealant is limited by inherent inaccuracies in the screen printing process. For example, if a line of sealant with a width of 150 $\mu$m is printed, the variation in line width may be up to approximately 25 $\mu$m.

Photolithography has been attempted, unsuccessfully, as a method to reduce the width of lines of sealant. For example, one attempt at using photolithography is set forth in FIGS. 2a–2e. In this method, a sealant 30 is first screen printed on the silicon cap wafer 28 incurred. Subsequently, as shown in FIG. 2b, a photoresist 32 is then applied over the sealant 30 and patterned, as shown in FIG. 2c, to define regions where it would be desirable to have sealant 30 remain on the silicon cap wafer 28 after subsequent processing. The sealant 30 then is etched, as shown in FIG. 2d, to remove excess sealant 30 from the areas other than where desired for sealing the silicon cap wafer 28 to a semiconductor wafer including active devices. After the excess sealant 30 has been removed, the remaining photoresist 32 is removed to produce a silicon cap wafer 28 carrying areas of sealant 30 defined by photolithography, as shown in FIG. 2e.

This method has proven satisfactory for depositing lines of solder sealant and other sealants for which acceptable etchants have been developed. Unfortunately, however, solder is unsuitable for many applications because of a mismatch between the coefficient of thermal expansion between typical solders and semiconductor substrates, which can cause the wafer to warp or crack. It is thus necessary to use a material, such as lead oxide glass, with a coefficient of thermal expansion that more closely matches the coefficient of thermal expansion of the substrates. Since lead oxide glass is a two-phase mixture, however, applicants have found that known etchants will attack preferentially only one phase of the two-phase mixture forming the lead-oxide glass resulting in a rather jagged line of sealant. Accordingly, it is not generally possible to etch two phase sealants such as lead-oxide glass.

Another attempt to optically define lines of sealant is illustrated in FIGS. 3a–3b. According to this embodiment, a photoresist and sealant mixture 38 is first coated on the silicon cap wafer 28 (FIG. 3a) and then patterned (FIG. 3b) to define regions where the sealant will remain after firing. The sealant and photoresist mixture 38 is hardened by firing or baking to remove excess solvent. One potential sealant/photoresist mixture 38 for use in this process is available from Dupont® under the trademark FODEL®. FODEL® is a material that incorporates photosensitive polymers and glass frit sealant materials, to allow patterning using UV light exposure. Unfortunately, FODEL® has a relatively high glazing temperature, and is thus not usable with many active areas, since heating the active area sufficiently to cause the FODEL® to reflow will damage the semiconductor device.

Thus, there is currently no method available to form narrow lines of sealant useable for sealing a cap wafer to an active area. Accordingly, what is needed is a method for capping active areas of a semiconductor wafer, while providing a high density of active areas on the semiconductor wafer.

SUMMARY OF THE INVENTION

In view of the foregoing, it would be advantageous to have a method for capping active areas of a semiconductor wafer, while providing a high density of active areas on the semiconductor wafer.

According to one embodiment of this invention, a method of defining sealant regions on a semiconductor wafer includes the steps of applying a photoimageable layer, photoimaging the photoimageable layer to define a pattern including remaining regions of the photoimageable layer and removed regions of the photoimageable layer, using the removed regions of the photoimageable layer to define the sealant regions on the semiconductor wafer; and applying sealant to the sealant regions defined by the pattern.

The method may further include one or more steps, such as curing the sealant to harden the sealant, removing the remaining regions after applying the sealant to the sealant regions, removing excess sealant not within the sealant regions, and using the sealant material to form at least one seal, such as a hermetic seal around at least one active area formed on the semiconductor wafer or a second semiconductor wafer.

According to another embodiment of this invention, a method of defining sealant regions on a semiconductor wafer using photolithography includes the steps of applying a photoresist to the semiconductor wafer, patterning the photoresist on the semiconductor wafer to define a pattern of photoresist including remaining regions of photoresist and removed regions of photoresist, applying sealant to the pattern, removing excess sealant, and removing the remaining photoresist.

In this embodiment, the steps of removing the excess sealant and removing the remaining photoresist may be performed in a lift-off process by etching the underlying photoresist. The step of applying sealant to the pattern may be accomplished by screen printing sealant onto the semiconductor wafer using a blank mask or a patterned mask, or by using a squeegee to distribute sealant into the pattern in the photoresist. The method may include the step of curing the photoresist prior to applying the sealant.

The method may also include the steps of curing the sealant and removing the excess sealant after curing the sealant, for example, by polishing. The method may further include the step of using the sealant material to form at least one seal, such as a hermetic seal, around at least one active area formed on the semiconductor wafer or a second semiconductor wafer. In this method, the sealant may be lead oxide glass and the photoresist may be polyamide.

According to a further embodiment of this invention, a method of defining sealant regions on a semiconductor wafer using photolithography includes the steps of providing a semiconductor wafer, applying a first layer of photoresist to the semiconductor wafer, patterning the first layer of photoresist to define a first pattern of photoresist including first remaining regions of photoresist and first removed regions of photoresist, etching the semiconductor wafer to form a topography on the semiconductor wafer, removing the first remaining regions of photoresist, and applying a layer of sealant to the topography of the semiconductor wafer.

In this method, the step of applying the layer of sealant may include the steps of applying a second layer of photoresist to the semiconductor wafer, patterning the second layer of photoresist to define a second pattern of photoresist including second remaining regions of photoresist and second removed regions of photoresist, applying sealant to the patterned second layer of photoresist, and removing excess sealant. In this method, a mask used to pattern the second layer of photoresist may be the inversed mask used to pattern the first layer of photoresist. Optionally, in this method, the step of etching the semiconductor wafer may occur prior to the step of applying sealant.

BRIEF DESCRIPTION OF THE DRAWINGS

This invention is pointed out with particularity in the appended claims. The above and further advantages of this invention may be better understood by referring to the following description when taken in conjunction with the accompanying drawings. The accompanying drawings are not intended to be drawn to scale. In the drawings, each identical or nearly identical component that is illustrated in various figures is represented by a like numeral. For purposes of clarity, not every component may be labeled in every drawing. In the drawings:

Figure 1:
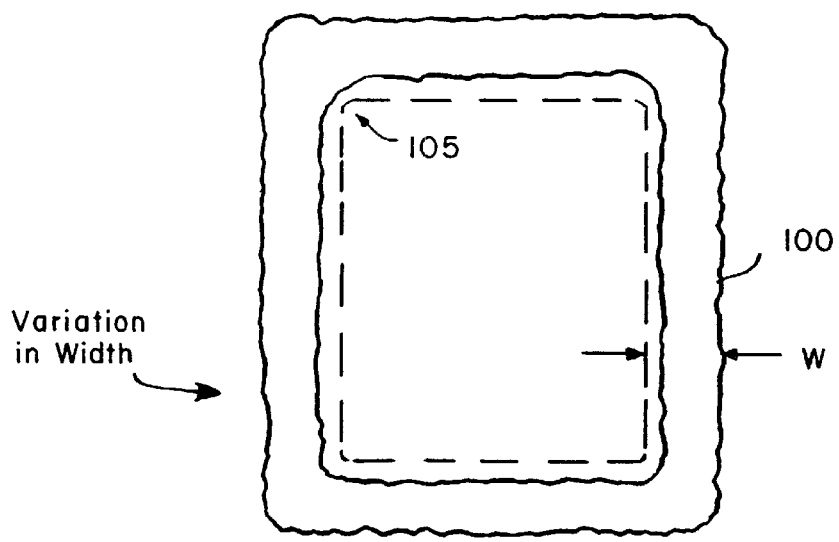
FIG. 1 is a photograph of sealant screen-printed on a cap wafer.
Figure 4:
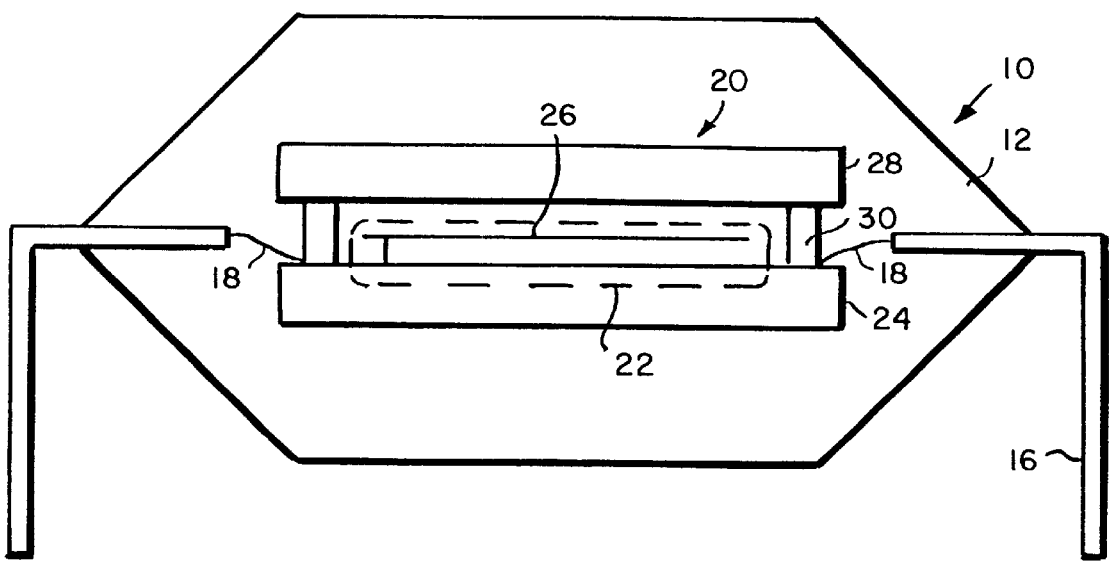
Figure 2A:
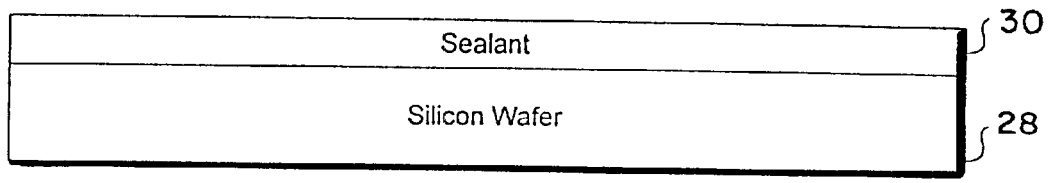
Figure 2B:
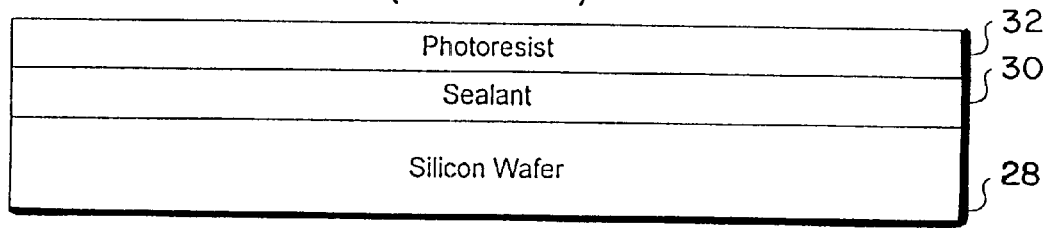
Figure 2C:
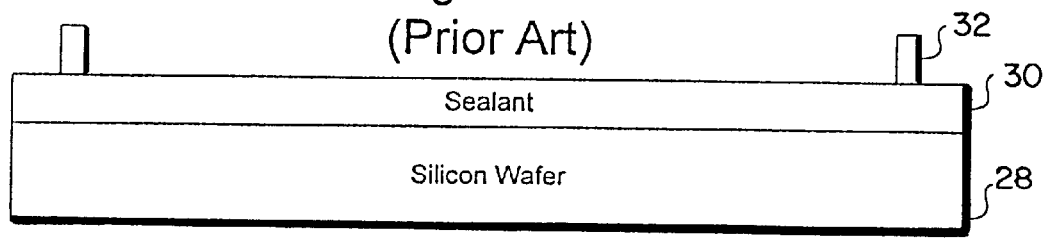
Figure 2D:
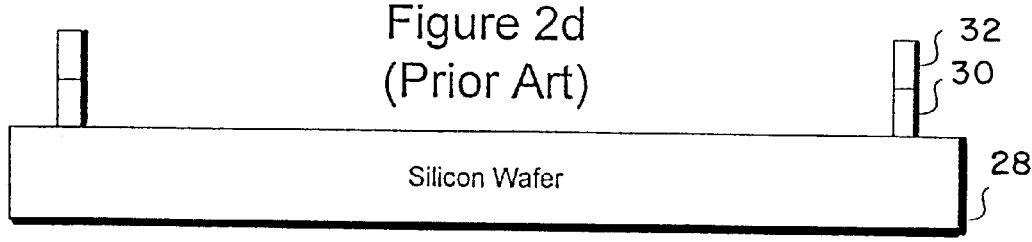
Figure 2E:
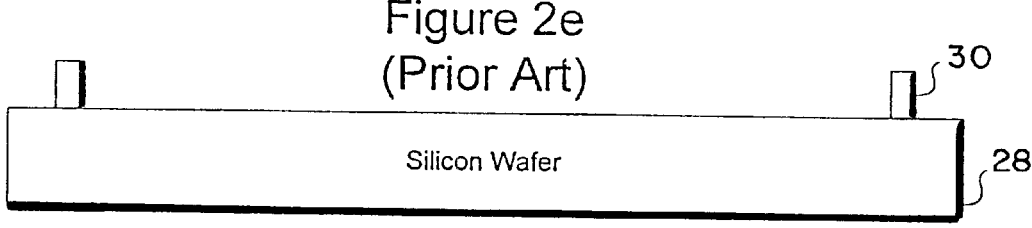
Figure 3A:
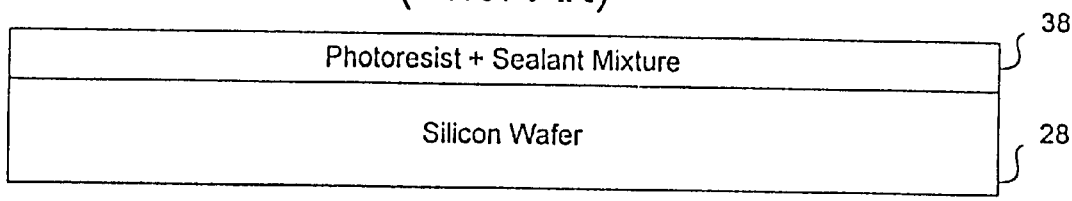
Figure 3B:
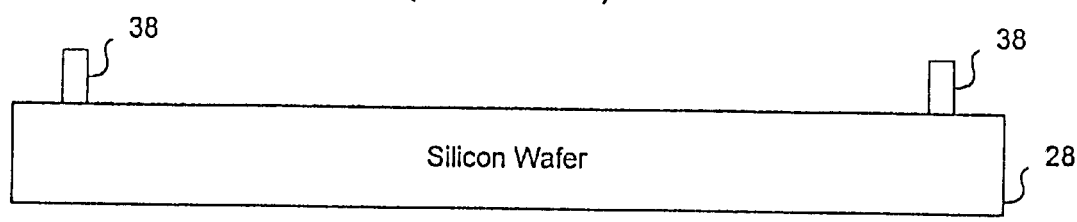
Figure 5:
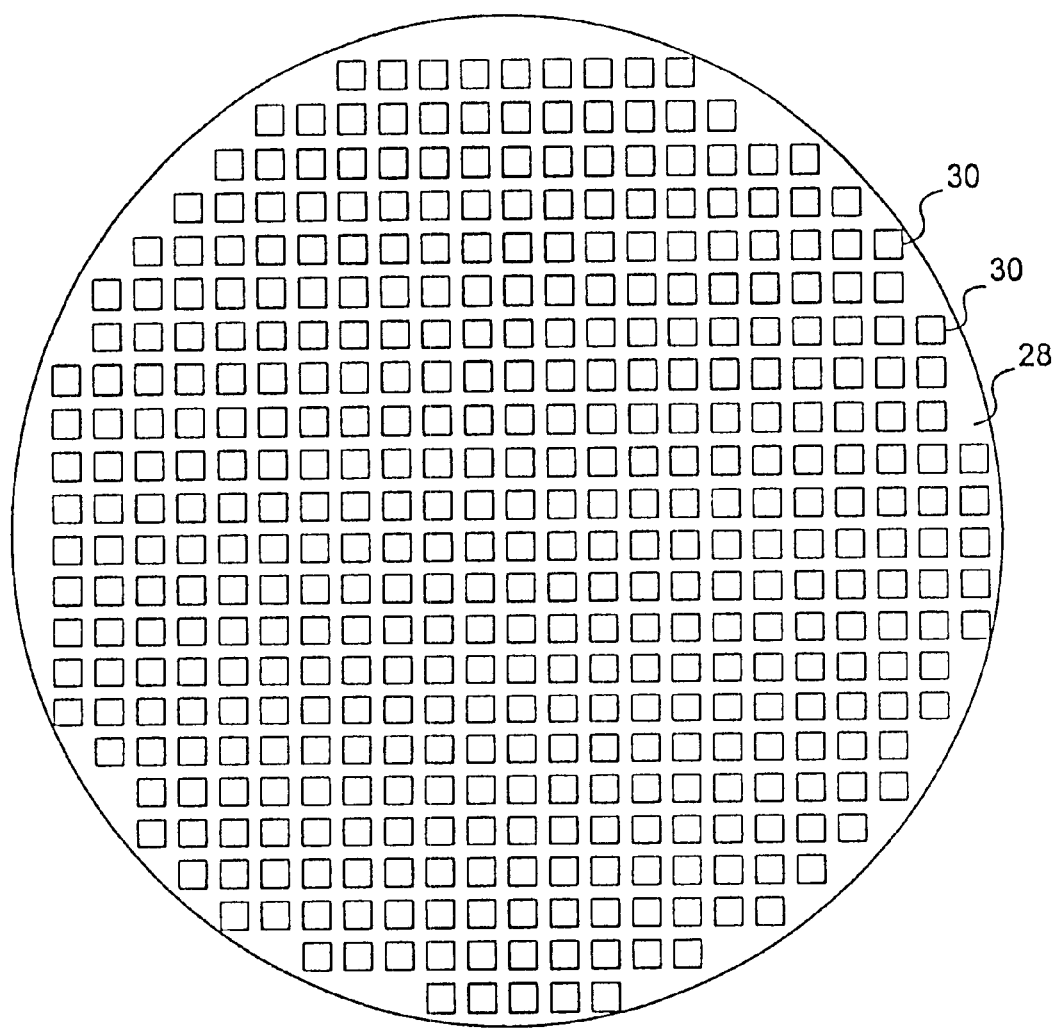
Figure 6:
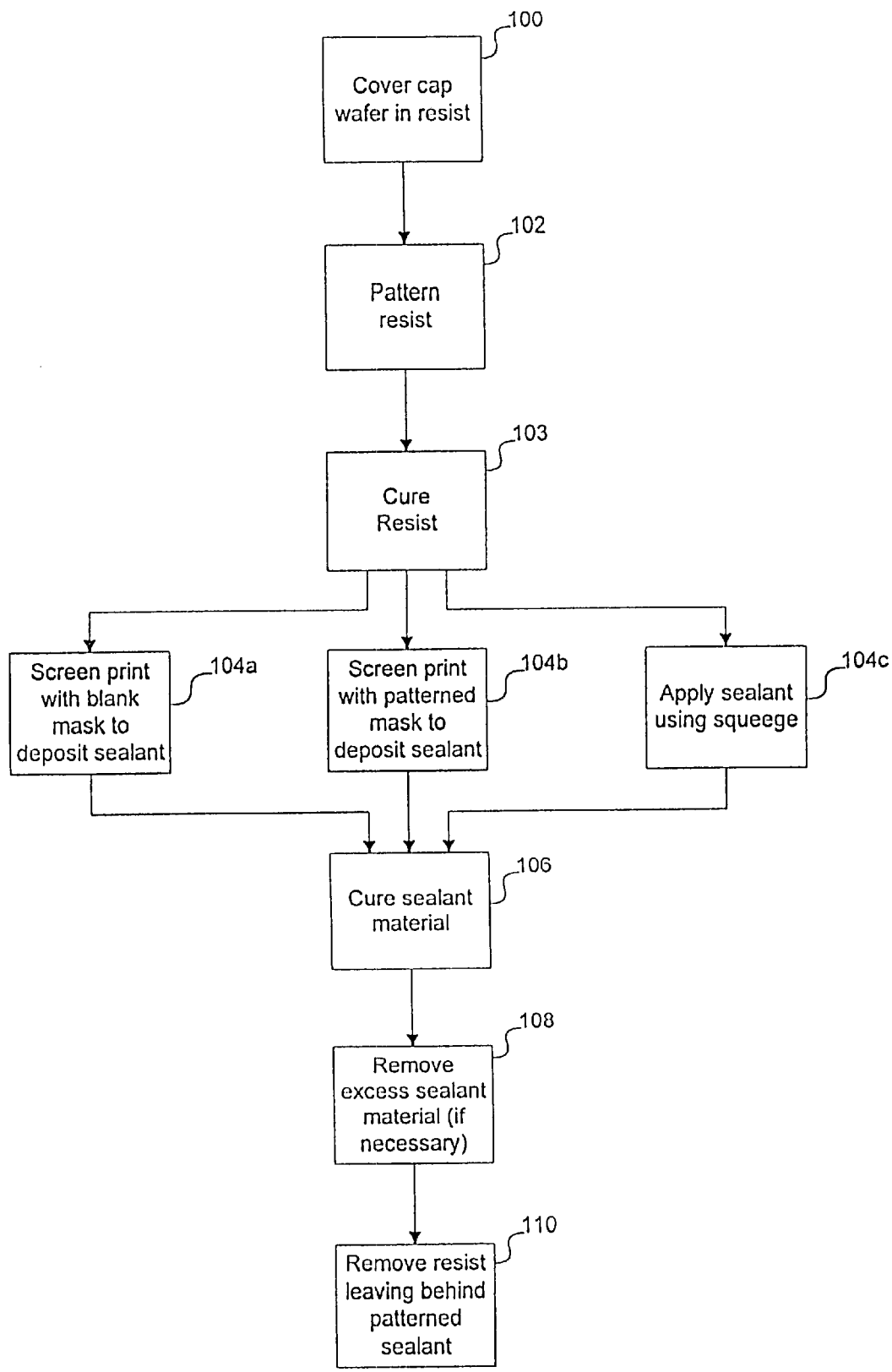
Figure 7A:
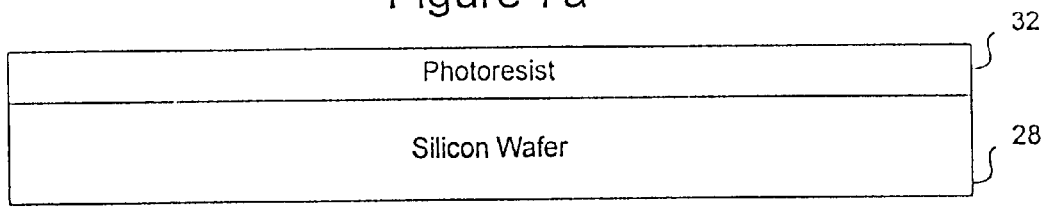
Figure 7B:
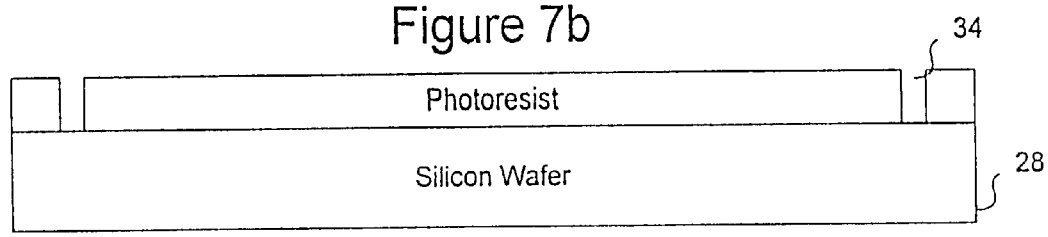
Figure 7C:
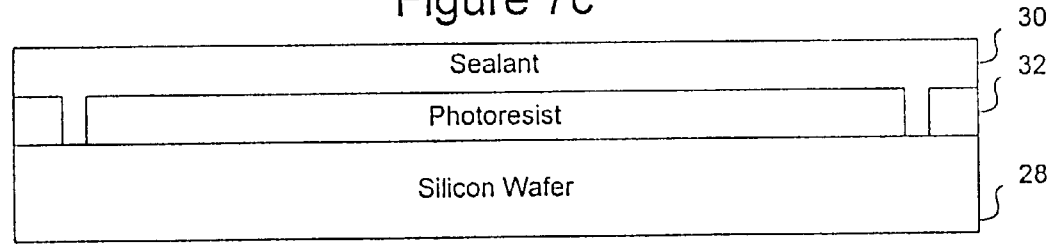
Figure 7D:
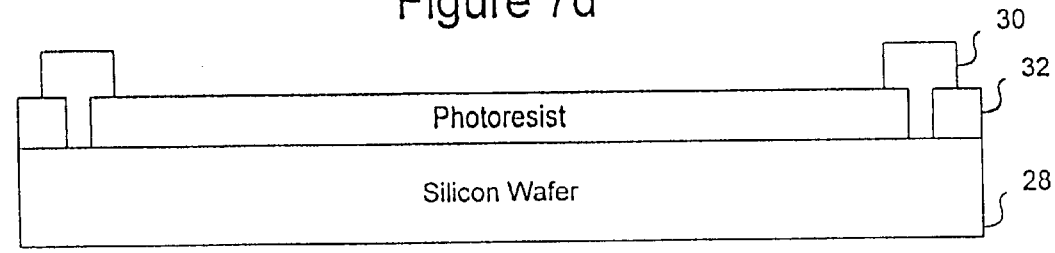
Figure 7E:
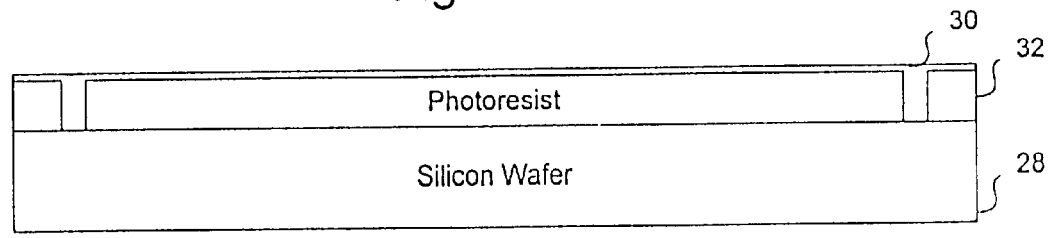

Each of FIGS. 2a–2e and 3a–3b is a cross-sectional view of a portion of a silicon wafer, showing in temporal order the wafer as it appears during conventional methods of defining regions of sealant on the wafer;

FIG. 4 is a side, cross-sectional view of a device including a micro-mechanical structure having a cover cap that is encapsulated in a molded plastic package according to one embodiment of this invention;

FIG. 5 is a plan view of a sealant pattern for use with a wafer including a plurality of active areas;

FIG. 6 is a flow chart illustrating a method of providing a narrow line of sealant material on a wafer;

Each of FIGS. 7a–7h is a cross-sectional view of a portion of a silicon wafer, such as the one illustrated in FIG. 5, showing in temporal order the wafer as it appears during steps of the method of providing the narrow line of sealant material set forth in FIG. 6. In this sequence of figures, each of FIGS. 7c, 7d, and 7e is a cross-sectional view of a portion of the wafer, such as the one illustrated in FIG. 5, as it appears during alternative steps corresponding to steps 104a, 104b, and 104c in FIG. 6 respectively; and Each of FIGS. 8a–8i and 9a–9e is a cross-sectional view of a portion of a wafer, such as the one illustrated in FIG. 5, showing in temporal order the wafer as it appears during alternative embodiments of a method of providing a narrow line of sealant material on the wafer.

DETAILED DESCRIPTION

According to the invention, the regions on the silicon cap wafer where sealant is to be applied are defined using photolithography. Photolithography is more precise than screen printing and enables narrower, more accurately defined lines of sealant to be formed. Accordingly, the amount of space required to hermetically seal a protective cover over individual active areas of the semiconductor wafer may be minimized, and hence the amount of space on the wafer available for forming the active areas may be maximized. It has been found that standard photolithography techniques may form lines of sealant with good corner definition and with very little variation in line width.

One embodiment of an electrical device sealed according to the inventive method described herein is shown in cross-section in FIG. 4. In the illustrated embodiment, the electrical device sealed by the cap wafer is a micro-mechanical structure. The invention is not limited in this regard, however, as this method may be used to encapsulate any active area of a semiconductor wafer.

As shown in FIG. 4, an electronic device 10 includes an active device 20 surrounded by packaging 12. The packaging 12 protects the active device 20 from one or more environmental hazards, such as water, particulate contamination, electromagnetic radiation, and other environmental conditions, and protects the active device 20 from impact, for example if the electronic device 10 were to be dropped. Additionally, the packaging 12 serves as a stable base for leads 16, 18 connected to the active device 20. Since the active device 20 may be relatively small and difficult to handle, the packaging 12 also provides a greater external surface area to the electronic device 10 than the external surface area of the active device 20, thereby making it easier to manipulate when manufacturing a piece of electronic equipment incorporating the electronic device 10.

In the embodiment illustrated in FIG. 4, the active device 20 is encapsulated in packaging material by disposing the active device 20 in a mold, connecting one or more bond wires 18 between the active device 20 and a lead frame 16, and molding packaging material around the active device 20 such as by injection molding. The invention is not limited in this regard, however, as any form of packaging may be used to encapsulate the active device 20. For example, the packaging 12 alternatively may be formed from top and bottom shells hermetically or otherwise sealed together about the active device 20.

The lead frame 16 enables signals to be transmitted from and to the active device 20. The use of lead frames during manufacturing of electronic devices 10 is well known. In the embodiment illustrated, the lead frame 16 is formed of electrically conductive metallic materials extending through the packaging and electrically connected to the active device 20 by bond wires 18. However, the invention is not limited in this regard. Rather, the lead frame 16, in one embodiment, may include one or more optical fibers, cables, windows, or other devices configured to transmit optical information to and/or from the active device 20 through the packaging.

The active device 20 includes an active region 22, the approximate boundary of which is indicated by dashed lines on a semiconductor substrate 24 that enables the semiconductor element to perform its specific function. In the illustrated embodiment, the active region 22 includes a micro-mechanical structure 26 configured to be used, for example, to enable the active device 20 to be used as an acceleration sensor. One such micro-mechanical device is disclosed in U.S. Pat. No. 5,847,280, entitled Monolithic Micromechanical Apparatus with Suspended Microstructure, the content of which is hereby incorporated by reference. The invention is not limited to an active region 22 including a micro-mechanical structure 26 as illustrated or as disclosed in U.S. Pat. No. 5,847,280, but rather encompasses any active region 22 that advantageously may be protected during the manufacturing process by capping.

A cap 28 is secured over the active region 22 of the silicon substrate 24 by a sealant 30. The cap 28 and sealant 30 protect the active region 22 from contaminants, such as contaminants that may be encountered during dicing, subsequent processing of the semiconductor wafer, or packaging.

By using photolithography to apply the sealant 30 precisely, it is possible to minimize the amount of space on the wafer 24 occupied by the sealant 30, thus making it possible to maximize the amount of space on the wafer 24 occupied by the active regions 22. Accordingly, if the size of each active region 22 remains static, reducing the amount of space occupied by the sealant 30 will result in an increased number of regions 22 on the chip wafer 24, which, in turn, increases the density of active areas on the semiconductor wafer 24.

In one embodiment of the instant invention, traditional screen printing techniques are supplemented or replaced by photo-imaging techniques to enable more precise lines of sealant 30 to be placed on the cap wafer 28 before the cap wafer 28 is attached to the semiconductor substrate. Although, in the illustrated embodiment, the sealant is formed on the cap wafer, the invention is not limited in this regard as the sealant may likewise be formed on the semiconductor wafer 24 carrying the active area 22. Likewise, any type of semiconductor wafer can be used, such as silicon, Germanium, quartz, PYREX, Silicon on insulator (SOI) wafers, sapphire wafer, and other similar wafers, and the invention is not limited to the particular type of wafer on which it is used.

One exemplary pattern of sealant 30 formed on a cap wafer 28 is illustrated in FIG. 5. As shown in FIG. 5, the sealant 30 may form a pattern to define areas of the cap wafer that will form protective caps for individual active regions 22. Although the embodiment illustrated in FIG. 5 has the sealant 30 disposed in square patterns, the invention is not limited to this embodiment, and other shapes may be formed by the sealant such as rectangles, triangles, circles, hexagons and other regular or irregular shapes. Typical design considerations, such as the wafer area occupied by the sealant and the wafer area consumed by dicing, may dictate the particular shape of the sealant pattern.

The sealant 30 may be formed from any commercially available sealant, such as glass or metal paste, including lead oxide glass paste or solder paste, electroplated solder, or other material capable of being used to attach the cap wafer 28 to the semiconductor wafer 24 carrying the active areas 22. Each of the sealant materials has advantages and disadvantages. For example, solder has a reflow temperature below 300° C., whereas the reflow temperature of other common sealants, such as lead oxide, glass, may be closer to or exceed 420° C. Thus, it may be advantageous to use solder when the active region 22 may be adversely affected by processing temperatures at or exceeding about 300° C. Unfortunately, solder typically has a higher coefficient of thermal expansion than the silicon wafer. This mismatch between coefficients of thermal expansion may stress both the cap 28 and silicon substrate and adversely affect the active region. By contrast, additives may be included in the lead oxide glass paste to cause the lead oxide glass, when cured, to have a coefficient of thermal expansion much more closely matched to the coefficient of thermal expansion of the silicon wafer. Accordingly, the reduced mismatch in coefficients of thermal expansion favors selection of lead oxide glass as the sealant whenever possible. Additionally, lead oxide glass has been proven as a hermetic sealant, thus further contributing to its selection as a sealant for applications requiring the active region to be hermetically sealed. Other types of sealants may be used as well. Selection of the appropriate sealant will therefore depend on the particular active region 22 being sealed, its characteristics, processing constraints, and the other design considerations.

One embodiment of the invention is directed to a method of using photolithography to define areas of sealant 30 to enable a cap 28 to be attached to a silicon substrate 24. This embodiment is described in greater detail in connection with FIGS. 6 and 7a–7h.

As shown in FIG. 6, in one embodiment, the inventive process includes multiple steps that, in combination, form narrow lines of sealant so that the area occupied by the sealant 30 on the silicon wafer 24 may be reduced. This enables the cap wafer 28 to protect the active area(s) 22 on the silicon wafer 24 while increasing the space available for formation of active areas 22 and hence the density of active areas 22 on the semiconductor wafer 24.

In this embodiment, as shown in FIG. 7a, the silicon cap wafer 28 is first covered in resist 32 such as photoresist or polyamide (step 100 in FIG. 6). In this embodiment, a photoresist or polyarnide is described since these substances are routinely used in the semiconductor industries as masking materials. The invention is not limited in this regard, however, and any photoimagable polymeric materials capable of being patterned may be used as a resist. Although it may be possible to perform the processing steps on the semiconductor wafer 24 containing the active areas 22 to be sealed, it is preferable to perform the processing steps on the cap wafer 28 to avoid the possibility that the processing steps attendant to applying the sealant 30 will alter or affect the properties of the active areas 22 on the semiconductor wafer 24.

The photoresist 32 is then imaged (step 102 in FIG. 6) to form a pattern of openings 34 in the photoresist 32 to receive sealant 30, and hence to define the location of the sealant 30 on the silicon cap wafer 28. Patterning of the photoresist 32 is shown in FIG. 7b. Patterning of the photoresist 32 may take place by photoimaging the photoresist 32 using standard techniques.

Once the photoresist 32 has been patterned the photoresist 32 is cured (step 103 in FIG. 6) sealant material 30 is applied (steps 104a, 104b, 104c in FIG. 6) and cured (step 106 in FIG. 6). As shown in FIG. 6, there are many ways to apply the sealant material 30. For example, once the photoresist 32 is photoimaged, sealant material 30 may be applied to the silicon cap wafer 28 by screen printing with a blank mask (step 104a in FIG. 6). FIG. 7c illustrates the result of applying sealant material 30 using a blank mask. This techniques eliminates the need to align anything with the patterned photoresist 32, but also is the most wasteful because sealant material 30 is applied to the entire silicon cap wafer 28 instead of only in those regions where required. Additionally, this technique increases the likelihood that a mismatch in coefficients of thermal expansion may cause the silicon cap wafer 28 to warp or crack as the sealant 30 is cured.

Alternatively, the sealant material 30 may be screen printed onto the silicon cap wafer 28 using a patterned screen to deposit the sealant material 30 only generally over the pattern in the photoresist 32 (step 104b in FIG. 6). FIG. 7d illustrates the result of applying sealant material 30 using a patterned mask. This technique allows for a reduced amount of sealant material 30 to be used, and hence reduces the cost associated with depositing the sealant 30. This technique is also advantageous in that the smaller amount of sealant material 30 reduces the possibility that a mismatch in coefficients of thermal expansion will cause the silicon cap wafer 28 to warp or crack. Additionally, providing sealant material 30 only generally over the pattern of the resist 32 enables excess sealant material 30 to be removed with a lift off process during step 108 of FIG. 6, which may be advantageous in certain applications (discussed below). Since the sealant 30 is applied only over the pattern in the resist 32, however, it is necessary to align the sealant material screen with the pattern in the resist.

A third alternative is to squeegee the sealant 30 into the pattern in the sealant 30 (step 104c of FIG. 6). FIG. 7e illustrates the result of applying sealant 30 using a squeegee.

In all three of these alternatives (FIGS. 7c–7e), the sealant material 30 is applied after the photoresist 32 has been photoimaged. Applying the sealant 30 after the photoresist 32 has been patterned enables the sealant 30 to fill and ultimately assume a configuration defined by the pattern in the photoresist 32. Since photolithography is more precise than screen printing, the present invention is more capable of defining precisely the regions where sealant 30 will be provided to attach the silicon cap wafer 28 to the semiconductor substrate 24 carrying the active regions 22. It may be possible to use other methods of applying sealant 30 to the patterned photoresist 32, or it may be possible to use combinations of the above-described methods, such as screen printing sealant 30 onto the hardened photoresist 32 prior to using a squeegee to distribute and remove excess sealant 30. The invention is not limited to any particular method of applying sealant 30 and is intended to encompass all variations thereof.

Figure 7F:
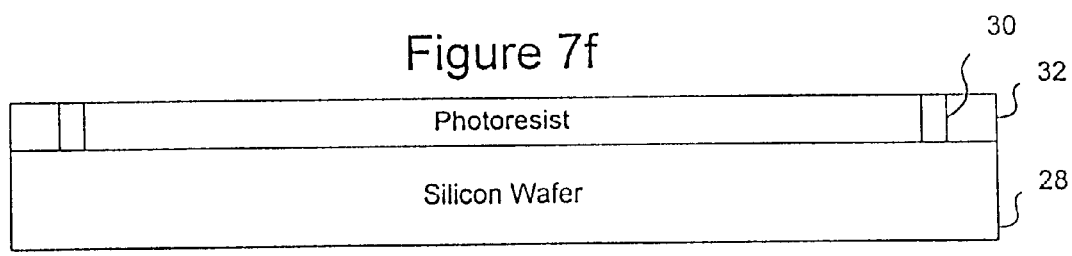

After the sealant 30 is applied, the sealant 30 is cured, typically by baking the sealant 30 (step 106 of FIG. 6), and excess sealant material 30 is removed (step 108 of FIG. 6). FIG. 7f illustrates the step of removing the excess sealant 30. Excess sealant 30 may be removed, for example, by etching, polishing or by performing a lift-off process. Other processes may alternatively be used to remove the excess sealant 30. The particular process selected to remove the excess sealant 30 depends on the particular physical characteristics of the device after the sealant 30 has been hardened.

Figure 7G:
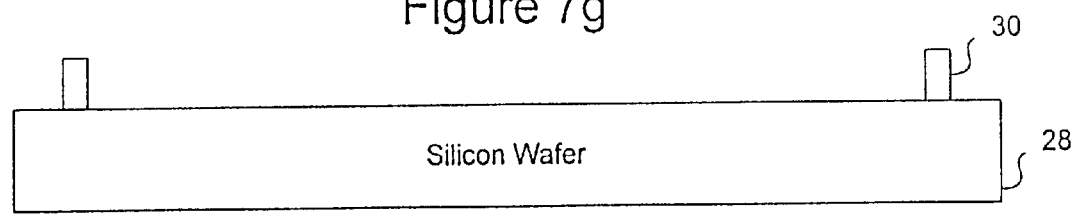
Figure 7H:
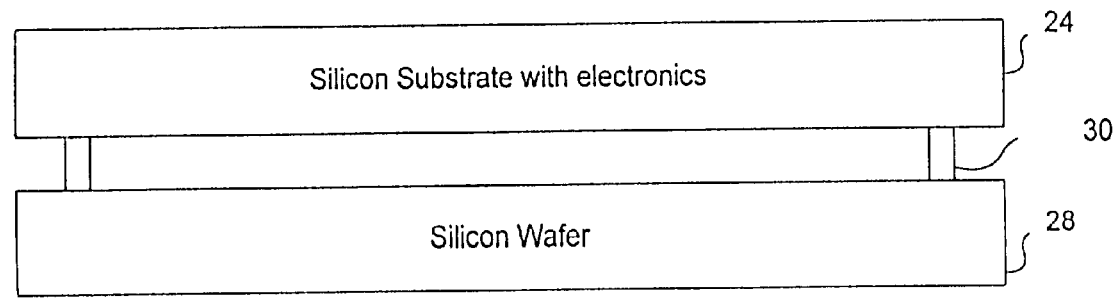

The remaining photoresist 32 then is removed (step 110 in FIG. 6) or may be removed simultaneously with the excess sealant 30 using a lift-off process to leave behind the patterned sealant 30 on the silicon cap wafer 28 (FIG. 7g).

The remaining photoresist 32 may be removed by any known process, such as dry etching or stripping. The particular etchants should be selected to attack the remaining photoresist 32 without significantly affecting the sealant 30 or the underlying silicon cap wafer 28.

Finally, the silicon cap wafer 28 carrying the patterned sealant 30 is used to cap the silicon substrate 24 carrying the active areas 22. Applying the silicon cap wafer 28 to the silicon substrate 24 may be done according to known techniques. Once applied, the silicon cap wafer 28 will form a seal, such as a hermetic seal, over one or more active areas 22 on the semiconductor substrate 24. Because the sealant 30 has been deposited with precision to enable the density of active areas 22 on the semiconductor wafer 24 to be increased, the margin of error in alignment between the silicon cap wafer 28 and semiconductor substrate 24 may be small.

Many alternative ways of using photolithography to define a pattern of sealant also are available. Several of these alternative methods are set forth in connection with FIGS. 8a–8i, and 9a–9e, each of which is discussed in greater detail below. All of these methods in some manner use photolithography to define the pattern of sealant 30 remaining for formation of the hermetic seal during the capping process. These alternative embodiments are not exhaustive, but rather illustrative of various methods of using photolithography to define the sealant pattern according to this invention. The invention is not limited to the disclosed embodiments.

Another embodiment of a method using photolithography to define the location of sealant 30 will now be described in connection with FIGS. 8a–8i. In this method, the silicon cap wafer 28 is etched to define recesses 34 corresponding to positions on the cap wafer 28 that will overly the active regions 22 on the semiconductor wafer 24 after the cap 28 is in place. This process may be used alone, as shown in FIGS. 8a–8i, or variations in the etching process may be used in connection with the other processes described herein.

Figure 8A:
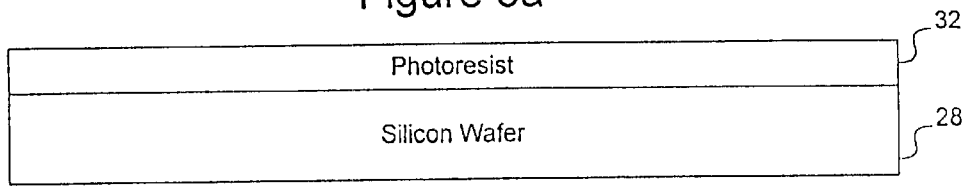
Figure 8B:
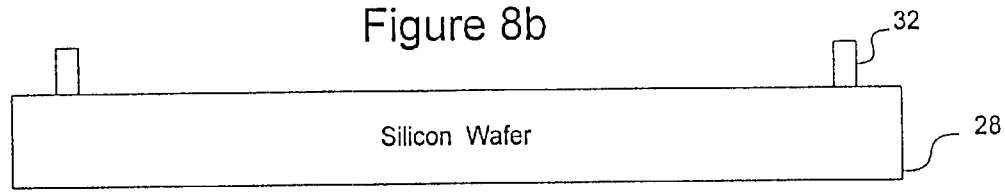
Figure 8C:
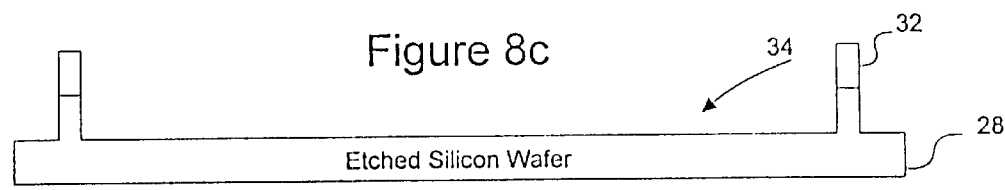
Figure 8D:
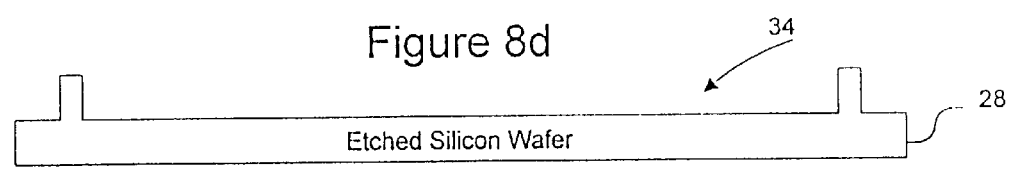
Figure 8E:
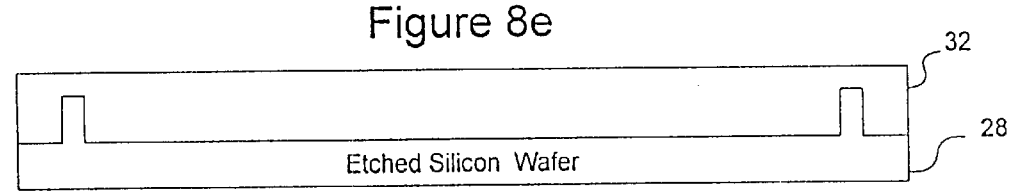

In this embodiment, as shown in FIG. 8a, a photoresist 30 is initially applied to a silicon cap wafer 28 and then patterned (FIG. 8b) to define locations where the silicon cap wafer 28 will be etched. The silicon cap wafer 28 is then etched (FIG. 8c) to define recesses 34 corresponding to positions on the silicon cap wafer 28 that will overly the active regions 22 on the semiconductor on substrate 24. After the topography of the silicon cap wafer 28 has been defined, the remaining photoresist 32 is removed (FIG. 8d).

Figure 8F:
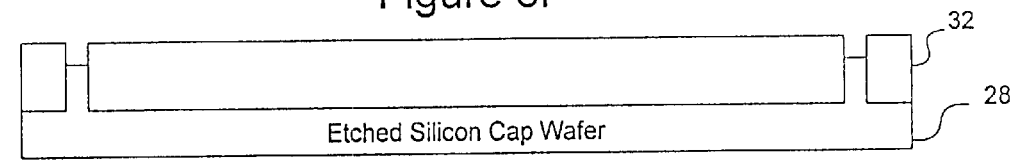
Figure 8G:
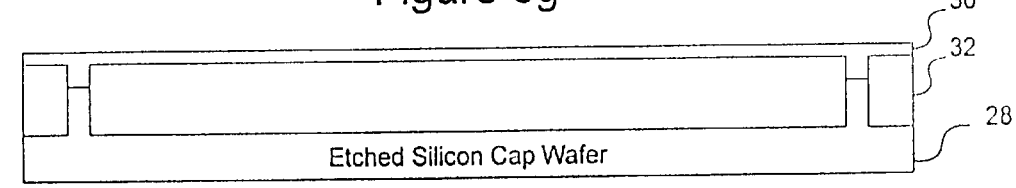
Figure 8H:
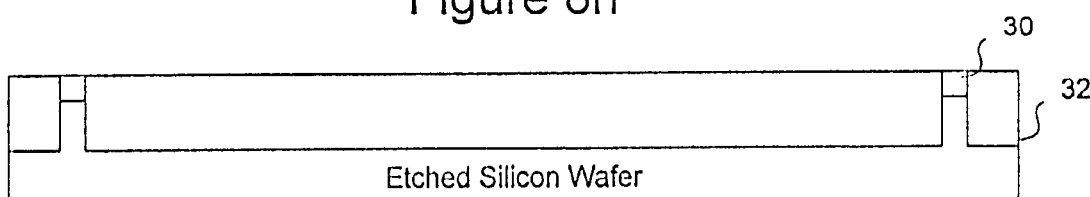
Figure 8I:
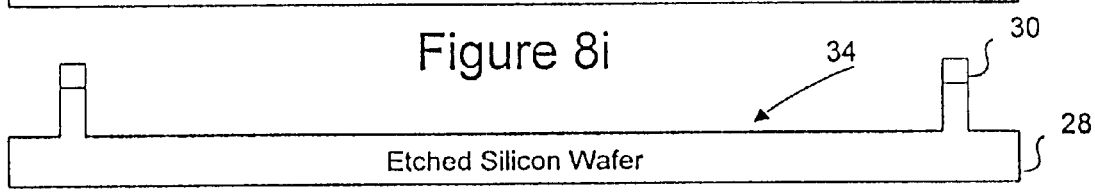

To deposit sealant on the topography of the silicon cap wafer 28, a layer of photoresist 32 is applied (FIG. 8e) and patterned to expose the top of the topography (FIG. 8f). A layer of sealant material is applied to the photoresist after the photoresist has been cured (FIG. 8g). As with all of the previous embodiments, the sealant 30 may be deposited in any one of a number of ways, such as screen printing using a blank screen, screen printing using a patterned screen, using a squeegee, etc., and the invention is not limited to using any particular method of applying the sealant 30.

The sealant 30 then is cured, typically by baking, and excess sealant 30 is removed by etching, polishing, or other process as discussed above in connection with FIGS. 7a–7h. As shown in FIG. 8g, the resultant product is an etched silicon cap wafer 28 having a topography carrying sealant 30. This allows a thinner layer of sealant to be used while increasing the stand-off distance between the cap wafer 28 and the semiconductor wafer 24.

Another method of defining areas of sealant 30 on a silicon cap wafer 28 is illustrated in FIGS. 9a–9e. In this method, the sealant 30 acts as a mask for subsequent etching of the silicon cap wafer 28 and thus the process is self-aligning.

Figure 9A:
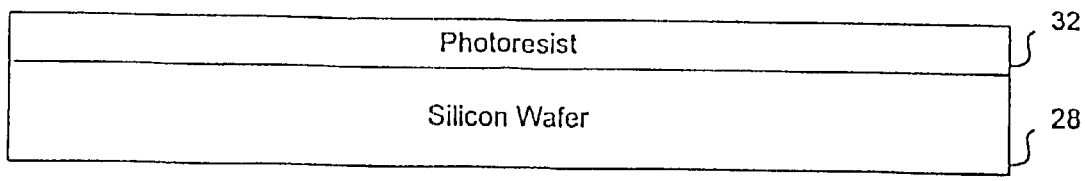
Figure 9B:
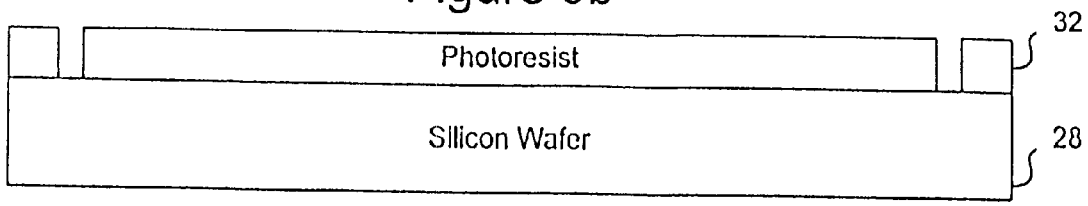
Figure 9C:
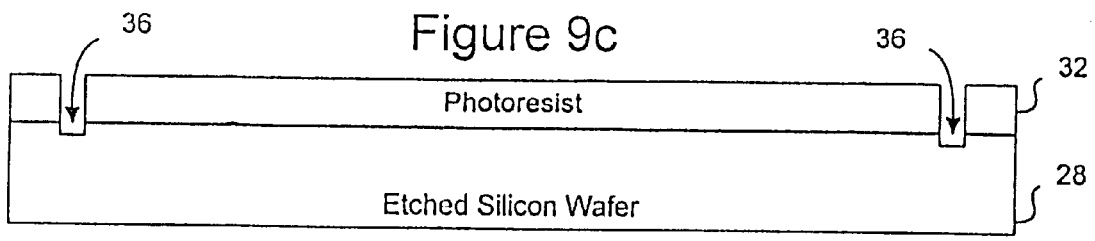
Figure 9D:
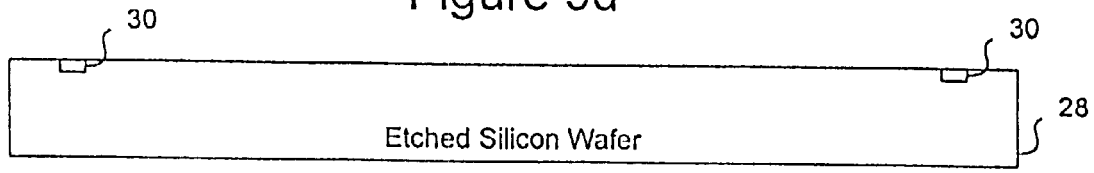
Figure 9E:
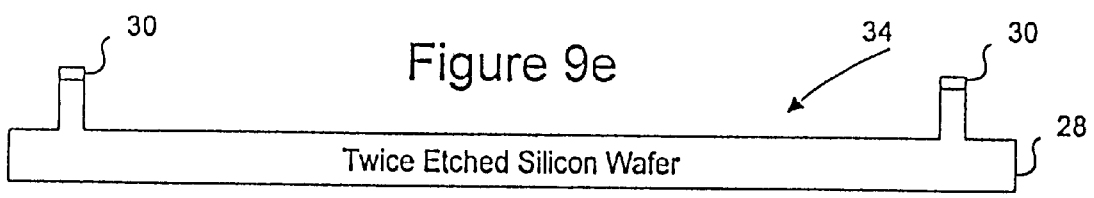

In this embodiment, as shown in FIG. 9a, a layer of photoresist 32 is first applied to the silicon cap wafer 28 and then patterned (FIG. 9b) to define locations where sealant will be applied to the silicon cap wafer 28.

Prior to applying sealant 30, however, the silicon cap wafer 28 is first etched (FIG. 9c) to define recesses 36 in the silicon cap wafer 28. The photoresist 32 is then removed (FIG. 9d) and sealant material 30 is deposited on the silicon cap wafer 28 and cured. The sealant 30 may be applied to fill in the recesses 36 in the silicon cap wafer 28 using a squeegee or any other technique. If necessary, excess sealant 30 may be removed after curing by polishing or another method.

Finally, the silicon wafer 28 is once again etched (FIG. 9e) to form recesses 34 in the silicon cap wafer 28. The etching is carried out, however, in such a manner that the sealant 30 acts as a mask during the etching process so that the recesses 34 etched in the silicon cap wafer 28 are self-aligned with the sealant 30. This process has the advantage of not requiring any masks to be aligned, thus simplifying the process and reducing the overall cost in terms of time and reliability. One exemplary etchant that may be used to etch the silicon substrate 24 without also etching the sealant 30, (lead oxide glass), is hydrofluoric acid. Likewise, this self-aligning process could be used to etch a topography in the semiconductor cap wafer after formation of the sealant pattern in FIG. 7g.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting.

What is claimed is:

1. A method of defining sealant regions on a semiconductor wafer, the method comprising the steps of:
    applying to the semiconductor wafer a photoimageable layer comprising photoimageable material:
    photoimaging the photoimageable layer to define a pattern comprising remaining regions of the photoimageable layer to remain after photoimaging and removed regions of the photoimageable layer to be removed by the photoimaging; and
    using the removed regions of the photoimageable layer to define the sealant regions on the semiconductor wafer.

2. The method of claim 1, further comprising the step of applying sealant to the sealant regions defined by the pattern.

3. The method of claim 2, further comprising the step of hardening the sealant.

4. The method of claim 2, further comprising the step of removing the photoimageable material from the remaining regions after applying the sealant to the sealant regions.

5. The method of claim 2, further comprising the step of removing excess sealant not within the sealant regions.

6. The method of claim 2, further comprising the steps of applying a cap wafer to the sealant and using the sealant to form at least one seal around at least one active area formed on the semiconductor wafer.

7. The method of claim 6, wherein the seal is hermetic.

8. A method of defining sealant regions on a semiconductor wafer using photolithography, the method comprising the steps of:

applying photoresist material to the semiconductor wafer;

patterning the photoresist material on the semiconductor wafer to remove the photoresist material from the semiconductor wafer in removed regions, the remaining photoresist material defining a pattern of photoresist material comprising remaining regions of photoresist;

applying sealant to the semiconductor wafer at least in the removed regions;

removing excess sealant; and removing photoresist in the remaining regions of photoresist from the semiconductor wafer.

9. The method of claim 8, wherein the steps of removing the excess sealant and removing the remaining photoresist are performed in a lift-off process by etching the underlying resist.

10. The method of claim 8, wherein the pattern defines sealant areas on the semiconductor wafer, said sealant areas being defined by the removed regions of photoresist.

11. The method of claim 8, wherein the step of applying sealant is accomplished by screen printing the sealant onto the semiconductor wafer using a blank mask.

12. The method of claim 8, wherein the step of applying sealant is accomplished by screen printing the sealant onto the semiconductor wafer using a patterned mask.

13. The method of claim 8, wherein the step of applying sealant is accomplished by using a squeegee to distribute the sealant.

14. The method of claim 8, further comprising the step of curing the photoresist prior to applying the sealant.

15. The method of claim 8, further comprising a step of curing the sealant.

16. The method of claim 15, wherein the step of removing excess sealant is performed after the step of curing the sealant.

17. The method of claim 15, wherein the step of removing excess sealant is accomplished by polishing.

18. The method of claim 8, wherein the sealant is a lead oxide glass.

19. The method of claim 8, wherein the photoresist is a polyamide.

20. The method of claim 8, further comprising the step of applying a cap wafer to the sealant and using the sealant to form at least one seal around at least one active area formed on the semiconductor wafer.

21. The method of claim 20, wherein the seal is hermetic.

22. The method of claim 8, wherein the step of removing the photoresist is performed using a dry etching or stripping process.

23. A method of defining sealant regions on a semiconductor wafer using photolithography, the method comprising the steps of:

providing a semiconductor wafer;

applying a first layer of photoresist material to the semiconductor wafer;

patterning the first layer of photoresist material on the semiconductor wafer to remove the first layer of photoresist material from the semiconductor wafer in first removed regions, the remaining photoresist material in the first layer of photoresist material defining a pattern of photoresist material comprising first remaining regions of photoresist material;

etching the semiconductor wafer to form a topography on the semiconductor wafer;

removing the first remaining regions of photoresist material; and applying a layer of sealant to the topography of the semiconductor wafer.

24. The method of claim 23, further comprising the steps of:

applying a second layer of photoresist material to the semiconductor wafer over the topography;

patterning the second layer of photoresist material to remove portions of the second layer of photoresist material, the remaining photoresist material in the second layer of photoresist material corresponding to the first removed regions of the first layer of photoresist material; and applying sealant to the removed regions of the second layer of photoresist material.

25. The method of claim 24, wherein a mask used to pattern the second layer of photoresist material is an inverse of a mask used to pattern the first layer of photoresist material.

26. The method of claim 23, wherein the sealant comprises a lead-oxide glass.

27. The method of claim 23, wherein the photoresist comprises a polyamide.

28. The method of claim 23, wherein the first remaining regions of photoresist material define the sealant regions on the semiconductor wafer.

29. A method of attaching a cap wafer to a semiconductor device, comprising the steps of:

applying a patternable material to the cap wafer;

patterning the material;

applying sealant material to the patterned material to form a pattern of sealant material on the cap wafer;

curing the sealant material;

removing excess sealant material;

removing the patternable material;

etching the cap wafer; and attaching the etched cap wafer with the sealant material to the semiconductor device.

* * * * *